Nov. 7, 1967 R. O. VIDAS 3,351,825

SEMICONDUCTOR DEVICE HAVING AN ANODIZED PROTECTIVE FILM THEREON AND METHOD OF MANUFACTURING SAME

Filed Dec. 21, 1964

INVENTOR.
ROBERT O. VIDAS
BY [signature]
ATTORNEY 3,351,825

SEMICONDUCTOR DEVICE HAVING AN ANODIZED PROTECTIVE FILM THEREON AND METHOD OF MANUFACTURING SAME

Robert O. Vidas, Richfield, Minn., assignor, by mesne assignments, to Solitron Devices, Inc., a corporation of New York Filed Dec. 21, 1964, Ser. No. 419,778
5 Claims. (Cl. 317—234)

The present invention is directed to improvements in semiconductor devices and is more particularly directed to semiconductor devices wherein a protective film is provided over the surface thereof to provide shielding from contamination.

Early in the development of semiconductor devices it was found that the surface of a semiconductor was prone to contamination and that this contamination produced undesirable effects on the operation of the devices. Particularly, the surface regions where junctions were exposed proved troublesome. Numerous attempts were made to remove these adverse effects by etching of the junction region and/or by coating of the surface of the semiconductor—including the junction—with some insulating material. The most commonly used coatings for this purpose have been metal oxides and in particular an oxide of the semiconductor body itself.

As the emphasis on the use of silicon as a semiconductor became more pronounced, the use of alloying techniques for the production of PN junction was superceded in large degree by solid state diffusion techniques. In solid state diffusion techniques, as currently practiced in the manufacture of silicon based devices, an oxide of silicon is thermally grown on the surface of a first conductivity type silicon, and then by use of photolithographic techniques and etching a portion of the surface of the silicon is exposed to an impurity producing substance of the opposite type. Then through prolonged heating at elevated temperatures the impurity is diffused into the silicon to produce a PN junction with a portion thereof extending to the surface of the silicon. When so desired a second diffusion may be made in like manner into a portion of the region of opposite conductivity produced by the first diffusion. Such a procedure is described in U.S. patent to J. Andrus 3,122,817. As a protective measure manufacturers have permanently left in place the oxide coating used as a mask for the diffusion. Electrode attachment is then made through openings produced in the oxide coating.

While the just described manner of fabricating semiconductor devices has been widely used, there are still problems that arise involving channeling effects which occur under the oxide at the surface of the semiconductor giving rise to leakage currents and related problems. As one solution it has been proposed to remove the oxide material used as the mask during diffusion, etch the surface, and then recover the surface of the semiconductor with a vacuum deposited silicon monoxide.

The present invention provides a means of eliminating the undesirable channeling effects while simultaneously providing electrode contacts to the desired regions of the semiconductor. This is accomplished by production of an anodically grown oxide coating over all of the exposed surfaces of the semiconductor.

The invention will be best understood from a study of the following description and drawings wherein.

Figure 1:
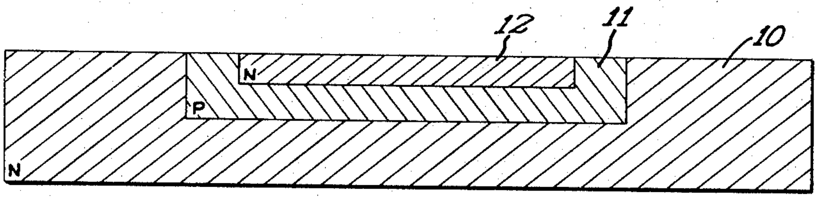
FIGURE 1 is a sectional view of a double diffused transistor produced in accordance with the previously described Andrus patent.

Referring now to the drawings there is illustrated in section in FIGURE 1 a body of semiconductor material generally indicated as 10 having N type conductivity. For the purposes of the following description the invention will be discussed with regard to silicon although other semiconductor materials may also be utilized. While the description will be with regard to a beginning base body of N type silicon the reverse, or even intrinsic material can be used.

Diffused into the body 10 are two regions 11 and 12 of P and N type dominant impurities. Such a structure is well known in the art and is described in some detail in the Andrus patent noted above. The oxide layer (not shown) used in masking for the diffusion of regions 11 and 12 has been stripped from the body. The specific etchant utilized for this purpose is not critical and may be, for example, an aqueous solution of ammonium fluoride. This etching will succeed in removing portions of the surface of the silicon material as well as removing the oxide formed on the surface. The depth penetration of this etchant into the block would not be significant as far as dimensions are concerned, but would be sufficient to remove regions causing the channeling surface effects.

Figure 2:
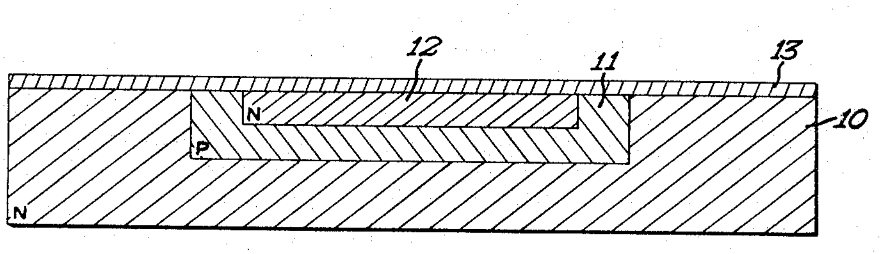
FIGURE 2 is the structure of FIGURE 1 wherein a film of an anodizable material has been produced on the upper surface thereof.

In FIGURE 2 the body 10 has been covered over the upper surface thereof with a film of anodizable material 13 which may be, for example, aluminum. The customary techniques for vacuum deposition of aluminum are satisfactory. It is desirable to maintain the temperature of the body 10 below that point at which any significant alloying of the aluminum will take place so as to avoid making nonohmic contact to the regions of P and N type. Customarily there will be an oxide layer on the back side of the semiconductor body 10 as well as on the upper surface where the diffusions have taken place. This oxide layer may also be removed prior to the deposition of the aluminum or it may be left in place. For the purpose of the present discussion it will be assumed that this oxide layer has been removed, although it should be appreciated that the invention can be performed when this oxide layer on the back side is left in place.

Figure 3:
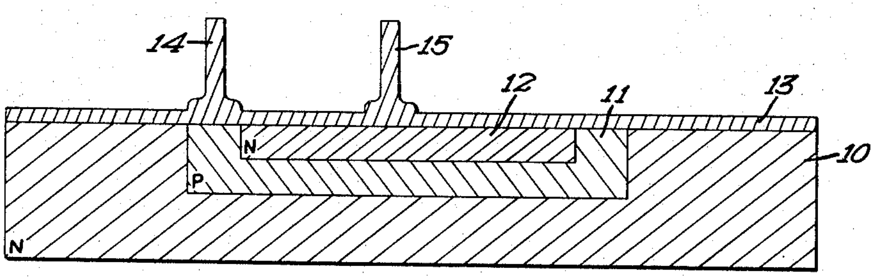
FIGURE 3 is the structure of FIGURE 2 wherein leads have been bonded to selected portions of the surface of the structure.

In FIGURE 3 the structure of FIGURE 2 is illustrated wherein metal leads of aluminum (or other anodizable metal) 14 and 15 have been welded to layer 13 in position within the regions 12 and 13 respectively where these regions are extended to the surface. The welding may be by ultrasonic of thermo-compression bonding as taught in the art.

Figure 4:
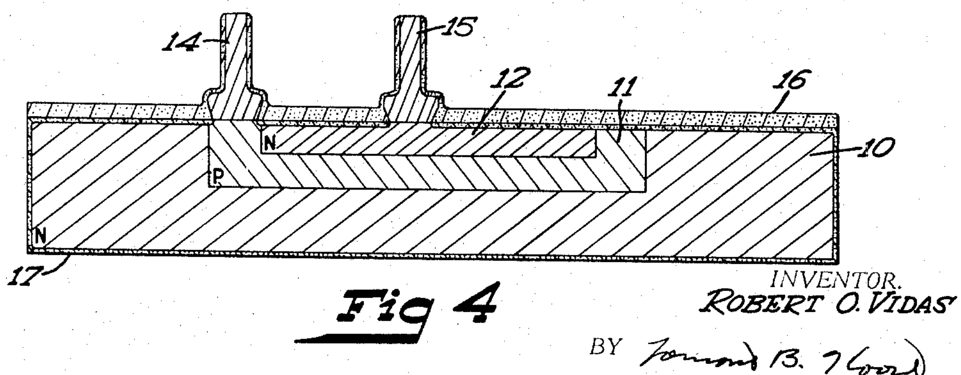
FIGURE 4 is the structure of FIGURE 3 following anodic oxidation.

In FIGURE 4 the device shown in FIGURE 3 has been anodized in appropriate electrolytes to form an oxide film over all of the exposed surfaces. The aluminum layer 13 has been entirely converted to aluminum oxide with the exception of that portion that underlies the leads, and is now indicated as 16. This aluminum oxide layer also covers members 14 and 15. The anodizing has been extended so as to penetrate to a slight degree into the actual semiconductor block 10 underneath layer 16. Likewise, the exposed surfaces of the silicon have been anodized to form a layer of silicon dioxide on the back side as well as on the edges of the body 10. The silicon dioxide film is indicated generally as 17. Note that this layer extends beneath layer 16.

It is thus apparent that a semiconductor device has been produced wherein an oxide layer has been produced over the entire surfaces of the body so as to provide a protective coating. In the example as described, the oxide has been extended deeply enough to actually oxidize portions of the surface of the silicon underlying the aluminum layer 13. This is a precautionary measure to insure that no channeling effects will have been produced through the deposition of layer 13 on the surface of the semiconductor body. Electrode 15 now provides an ohmic emitter contact with electrode 14 providing an ohmic base region contact. The device may then be processed in accordance with the known procedures to remove the oxide layer on the back side of the device so as to provide a contact to the collector region and a mounting arrangement for good heat dissipation. A suitable mounting procedure is to use a 98 gold-2 silicon solder to bond the wafer to a mounting pedestal.

A number of different baths will prove satisfactory in producing the anodic oxide films over the body in accordance with the invention. The common sulfuric acid type anodizing bath is quite useful in this regard for a metal such as aluminum. When other anodizable metals are used in place of aluminum in forming layer 13 it will be apparent that other electrolyte baths will prove better in producing the anodic film.

The thickness of the anodizable metal 13 may be varied over a considerable latitude. As a practical matter the metal 13 should be of sufficient thickness to facilitate attaching of leads and of sufficient thickness to insure that the anodic oxide layer will provide an effective shield against contamination. This latter requirement is of lesser significance as one may add to the layer by anodically creating protective oxide from the silicon material underlying the metal 13. A metal layer in the area of 0.00005 inch in thickness is satisfactory. A final protective oxide of 3000 A. provides good protection.

It is further contemplated that the invention will find use where the collector contact is also to be made to the upper surface of the device. This can be readily accomplished by the simple procedure of adding a third lead member to the upper surface prior to anodizing.

I claim:

1. The method of manufacturing a semiconductor device comprising:

(a) selectively masking a semiconductive body of a first conductivity type (b) diffusing into the unmasked portions of a face of said body an impurity capable of changing the conductivity of the body beneath said unmasked portion to the opposite type conductivity (c) removing the masking material from said face to expose the surface of said semiconductor (d) depositing an anodizable metal on to at least portions of the surface of said face (e) anodically treating said assembly to produce an oxide over all the exposed surface of said assembly, said oxide being of a metal other than semiconductor metal.

2. A semiconductor device comprising a body of semiconductor material of a first conductivity type having at least one region of opposite conductivity type diffused into and beneath a surface thereof defining a PN junction extending to the surface thereof, electrodes in ohmic contact to said body and to said region, and a layer of an anodically grown oxide of a metal other than said semiconductor material, said oxide layer covering at least that portion of said surface where said PN junction reaches said surface and covering at least a portion of said electrodes.

3. A semiconductor device comprising a body of silicon of a first conductivity type having at least one region of opposite conductivity type diffused into and beneath a first surface thereof defining a PN junction extending to the surface thereof, electrodes in ohmic contact to said body and said regions, a layer of anodically grown silicon oxide covering at least the region of said surface where said PN junction reaches the surface, and a second anodically grown oxide of aluminum in contiguous engagement with said silicon oxide and in covering relationship thereto.

4. A semiconductor device comprising a body of silicon of a first conductivity type having at least one region of opposite conductivity type diffused into and beneath a first surface thereof defining a PN junction extending to the surface thereof, electrodes in ohmic contact to said body and said regions, a layer of anodically grown silicon oxide covering at least the region of said surface where said PN junction reaches the surface, and a second anodically grown oxide of a metal other than silicon in contiguous engagement with said silicon oxide and in covering relationship thereto.

5. The method of manufacturing a semiconductor device comprising:

(a) selectively masking a body of a semiconductive material of a first conductivity type (b) diffusing into the unmasked portions of a face of said body an impurity capable of changing the conductivity of the body beneath said unmasked portion to the opposite type conductivity (c) removing the masking material from said face to expose the surface of said semiconductor (d) depositing an anodizable metal on to at least portions of the surface of said face, said metal being of a material other than said semiconducting material.

(e) attaching lead means to said metal at portions overlying said different conductivity type regions (f) anodically treating said assembly to convert all of said metal into a metal oxide.

References Cited

UNITED STATES PATENTS

| | | | |
|---|---|---|---|
| 3,010,885 | 11/1961 | Schink | 204—32 |
| 3,097,308 | 7/1963 | Wallmark | 317—235 X |
| 3,154,439 | 10/1964 | Robinson | 117—200 X |
| 3,240,685 | 3/1966 | Maissel | 204—42 |
| 3,247,428 | 4/1966 | Perri et al. | 317—234 |

FOREIGN PATENTS

| | | |
|---|---|---|
| 243,535 | 2/1963 | Australia. |

JOHN W. HUCKERT, *Primary Examiner.*

A. M. LESNIAK, *Assistant Examiner.*